(12) United States Patent
Manne et al.

(10) Patent No.: US 10,930,478 B2
(45) Date of Patent: Feb. 23, 2021

(54) APPARATUS WITH OPTICAL CAVITY FOR DETERMINING PROCESS RATE

(71) Applicant: Lam Research Corporation, Fremont, CA (US)

(72) Inventors: Jagadeeshwari Manne, Fremont, CA (US); Yassine Kabouzi, Fremont, CA (US); Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 314 days.

(21) Appl. No.: 15/988,411

(22) Filed: May 24, 2018

(65) Prior Publication Data

US 2019/0362950 A1 Nov. 28, 2019

(51) Int. Cl.
*H01J 37/32* (2006.01)
*H01L 21/3065* (2006.01)
*H01J 37/22* (2006.01)

(52) U.S. Cl.
CPC ...... *H01J 37/32981* (2013.01); *H01J 37/226* (2013.01); *H01J 37/32458* (2013.01); *H01J 37/32834* (2013.01); *H01J 37/32935* (2013.01); *H01L 21/3065* (2013.01)

(58) Field of Classification Search
CPC .......... H01J 37/32458; H01J 37/32935; H01J 37/226; H01J 37/32834; H01J 37/32981; H01L 21/3065
See application file for complete search history.

(56) References Cited

U.S. PATENT DOCUMENTS

| | | |
|---|---|---|
| 2002/0026251 A1 | 2/2002 | Johnson et al. |
| 2008/0099450 A1 | 5/2008 | Lewington et al. |
| 2015/0170977 A1 | 6/2015 | Singh |
| 2017/0084426 A1 | 3/2017 | Albarede et al. |
| 2017/0221781 A1 | 8/2017 | Theisen et al. |

OTHER PUBLICATIONS

International Search Report and Written Opinion for International Application No. PCT/US2019/030639 dated Aug. 19, 2019.

*Primary Examiner* — Yuechuan Yu
(74) *Attorney, Agent, or Firm* — Beyer Law Group LLP

(57) ABSTRACT

An apparatus for processing a substrate is provided. A processing chamber is provided. A substrate support is within the processing chamber. A gas inlet provides a process gas into the processing chamber. A gas source provides the process gas to the gas inlet. An exhaust pump pumps gas from the processing chamber. A parameter measurement system comprises a cavity ring down device in fluid communication with the processing chamber, comprising a first cavity ring down mirror on a first side of the cavity ring down device and a second cavity ring down mirror on a second side of the cavity ring down device spaced apart from the first cavity ring down mirror. At least one laser light source is optically coupled to the first cavity ring down mirror. A light detector is optically coupled to either the first cavity ring down mirror or the second cavity ring down mirror.

14 Claims, 7 Drawing Sheets

APPARATUS WITH OPTICAL CAVITY FOR DETERMINING PROCESS RATE

BACKGROUND

The present disclosure relates to the manufacturing of semiconductor devices. More specifically, the disclosure relates to etching used in manufacturing semiconductor devices.

During semiconductor wafer processing, silicon containing layers are selectively etched. Processing rates or end points may be determined during such etch processes.

SUMMARY

To achieve the foregoing and in accordance with the purpose of the present disclosure, an apparatus for processing a substrate is provided. A processing chamber is provided. A substrate support is within the processing chamber. A gas inlet provides a process gas into the processing chamber, wherein when a process is carried out to process a substrate in the processing chamber the process provides a gas byproduct. A gas source provides the process gas to the gas inlet. An exhaust pump pumps the gas byproduct from the processing chamber. A parameter measurement system comprises a cavity ring down device in fluid communication with the processing chamber, comprising a first cavity ring down mirror on a first side of the cavity ring down device and a second cavity ring down mirror on a second side of the cavity ring down device spaced apart from the first cavity ring down mirror. At least one laser light source is optically coupled to the first cavity ring down mirror. A light detector is optically coupled to either the first cavity ring down mirror or the second cavity ring down mirror.

In another manifestation, a parameter measurement system in fluid connection with a plasma processing chamber for controlling a process for processing a substrate is provided. A cavity ring down device, comprises a first cavity ring down mirror on a first side of the cavity ring down device and a second cavity ring down mirror on a second side of the cavity ring down device spaced apart from the first cavity ring down mirror. At least one laser light source is optically coupled to the first cavity ring down mirror, wherein the first cavity ring down mirror and the second cavity ring down mirror have a reflectivity to light from the at least one laser light source of at least 99.9% and transmission of light from the at least one laser light source of 0.1% to 0.001%. A light detector is optically coupled to either the first cavity ring down mirror or the second cavity ring down mirror. A controller is configured to use a sample received from the plasma processing chamber and the light from the at least one laser light source and reflected between the first and second cavity ring down mirrors to measure one or more process parameters and adjust the process based on the one or more process parameters.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1:
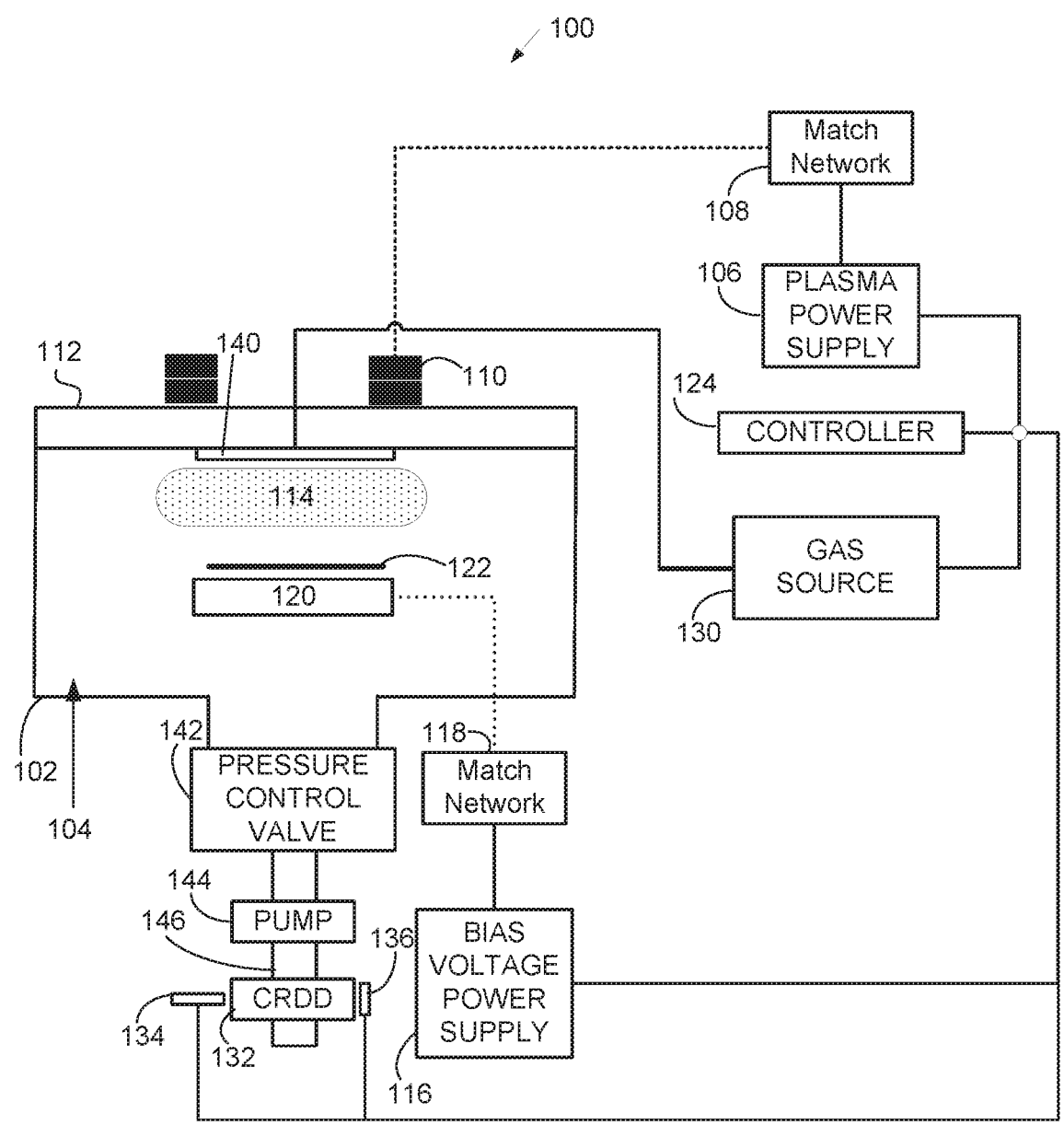
FIG. 1 schematically illustrates an example of a plasma processing chamber in an embodiment.

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Current technology used for process control (e.g. endpoint) relies on relative measurements or indirect measurements of plasma parameters using emission spectroscopy, reflectance, or RF voltage and current. For endpoint control, optical emission spectroscopy reaches its limits with signal changes tending to zero when critical dimensions (CD) shrink below 21 nanometers (nm) and aspect ratio increases beyond 30:1. For in-situ etch rate (ER) measurements using radio frequency (RF), voltage/current are based on correlations that are not always maintained chamber to chamber.

An embodiment relies on absolute measurements of silicon tetrafluoride ($SiF_4$) or silicon tetrabromide ($SiBr_4$), or silicon tetra chloride ($SiCl_4$) or other $SiX_4$ byproducts that is a direct byproduct of most silicon containing etches (nitrides, oxides, poly, and silicon films) when using fluorocarbon based chemistries. By combining the measurement with an etch model ($SiF_4$ mass balance based on x-ray scanning electron microscope (XSEM) images or a feature profile simulation model calibrated with XSEM images), one can predict endpoint, ER as a function of depth, average wafer selectivity, and uniformity in certain conditions. The $SiF_4$ byproducts are detected using a cavity ring down device allowing parts per trillion level detection for accurate predictions.

This disclosure describes an embodiment that combines etch-profile modeling coupled with $SiF_4$ IR-absorption to control the etch process. The method allows the extension of endpoint detection capability beyond the reach of tradition methods, such as emission spectroscopy, in high-aspect ratio applications such as dynamic random access memory (DRAM) cell-etch and three dimensional negative-and (3D-NAND) hole and trench patterning. The combination of absolute density measurement and etch profile emission modeling allows one to additionally determine in-situ etch process parameters such as ER, selectivity, and uniformity that can be used to achieve run-to-run process matching.

In an embodiment, an etch process is characterized by measuring a direct stable byproduct that can be used to determine: 1) Endpoint for high-aspect ratio DRAM and 3D-NAND etches for process/CD control, 2) Method to scale endpoint detection for future nodes, 3) Combined with a model one can determine in-situ: a) Average wafer ER and ER as a function of depth for aspect ratio dependent etching (ARDE), b) An average wafer uniformity and selectivity, and c) Both measurements can be used for run-to-run matching and fault detection, 4) Using a cavity ring down device allowing parts per trillion level detection needed for accurate etch endpoint and etch parameters estimation.

FIG. 1 schematically illustrates an example of a plasma processing system 100, which may be used to perform the process of etching a silicon containing layer in accordance with one embodiment. The plasma processing system 100 includes a plasma reactor 102 having a plasma processing confinement chamber 104 therein. A plasma power supply 106, tuned by a match network 108, supplies power to a transformer coupled plasma (TCP) coil 110 located near a power window 112 to create a plasma 114 in the plasma processing confinement chamber 104 by providing an inductively coupled power. The TCP coil (upper power source) 110 may be configured to produce a uniform diffusion profile within the plasma processing confinement chamber 104. For example, the TCP coil 110 may be configured to generate a toroidal power distribution in the plasma 114. The power window 112 is provided to separate the TCP coil 110 from the plasma processing confinement chamber 104 while allowing energy to pass from the TCP coil 110 to the plasma processing confinement chamber 104. A wafer bias voltage power supply 116 tuned by a match network 118 provides power to an electrode 120 to set the bias voltage on the substrate 122. The substrate 122 is supported by the electrode 120, which also acts as a substrate support. A controller 124 sets operating and/or process points for the plasma power supply 106 and the wafer bias voltage power supply 116.

The plasma power supply 106 and the wafer bias voltage power supply 116 may be configured to operate at specific radio frequencies such as, for example, 13.56 MHz, 27 MHz, 2 MHz, 60 MHz, 200 kHz, 2.54 GHz, 400 kHz, and 1 MHz, or combinations thereof. Plasma power supply 106 and wafer bias voltage power supply 116 may be appropriately sized to supply a range of powers in order to achieve desired process performance. For example, in one embodiment, the plasma power supply 106 may supply the power in a range of 50 to 5000 Watts, and the wafer bias voltage power supply 116 may supply a bias voltage in a range of 20 to 2000 V. For a bias voltage up to 4 kV or 5 kV, a power of no more than 25 kW is provided. In addition, the TCP coil 110 and/or the electrode 120 may be comprised of two or more sub-coils or sub-electrodes, which may be powered by a single power supply or powered by multiple power supplies.

As shown in FIG. 1, the plasma processing system 100 further includes a gas source/gas supply mechanism 130. The gas source 130 is in fluid connection with the plasma processing confinement chamber 104 through a gas inlet, such as a shower head 140. The gas inlet may be located in any advantageous location in the plasma processing confinement chamber 104, and may take any form for injecting gas. Preferably, however, the gas inlet may be configured to produce a "tunable" gas injection profile, which allows independent adjustment of the respective flow of the gases to multiple zones in the plasma processing confinement chamber 104. The process gases and byproducts are removed from the plasma processing confinement chamber 104 via a pressure control valve 142 and an exhaust pump 144. The pressure control valve 142 and the exhaust pump 144 also collectively serve to maintain a desired pressure within the plasma processing confinement chamber 104. The gas source/gas supply mechanism 130 is controlled by the controller 124.

In this embodiment, a cavity ring down device (CRDD) 132 is connected to the exhaust pump 144 via an exhaust pipe 146. Exhaust gas flows into the CRDD 132. A laser light source 134 is positioned adjacent to the CRDD 132, so that a laser beam from the laser light source 134 is directed into the CRDD 132. The laser beam can traverse the length of the CRDD 132 multiple times (typically for a distance greater than 1 kilometer) to allow parts per trillion (ppt) level detection limits to be achieved. The laser beam is absorbed by the exhaust gas present within the CRDD 132 as it travels inside the CRDD 132. A light detector 136 is positioned adjacent to the CRDD 132 to measure the light absorption level.

Figure 2:
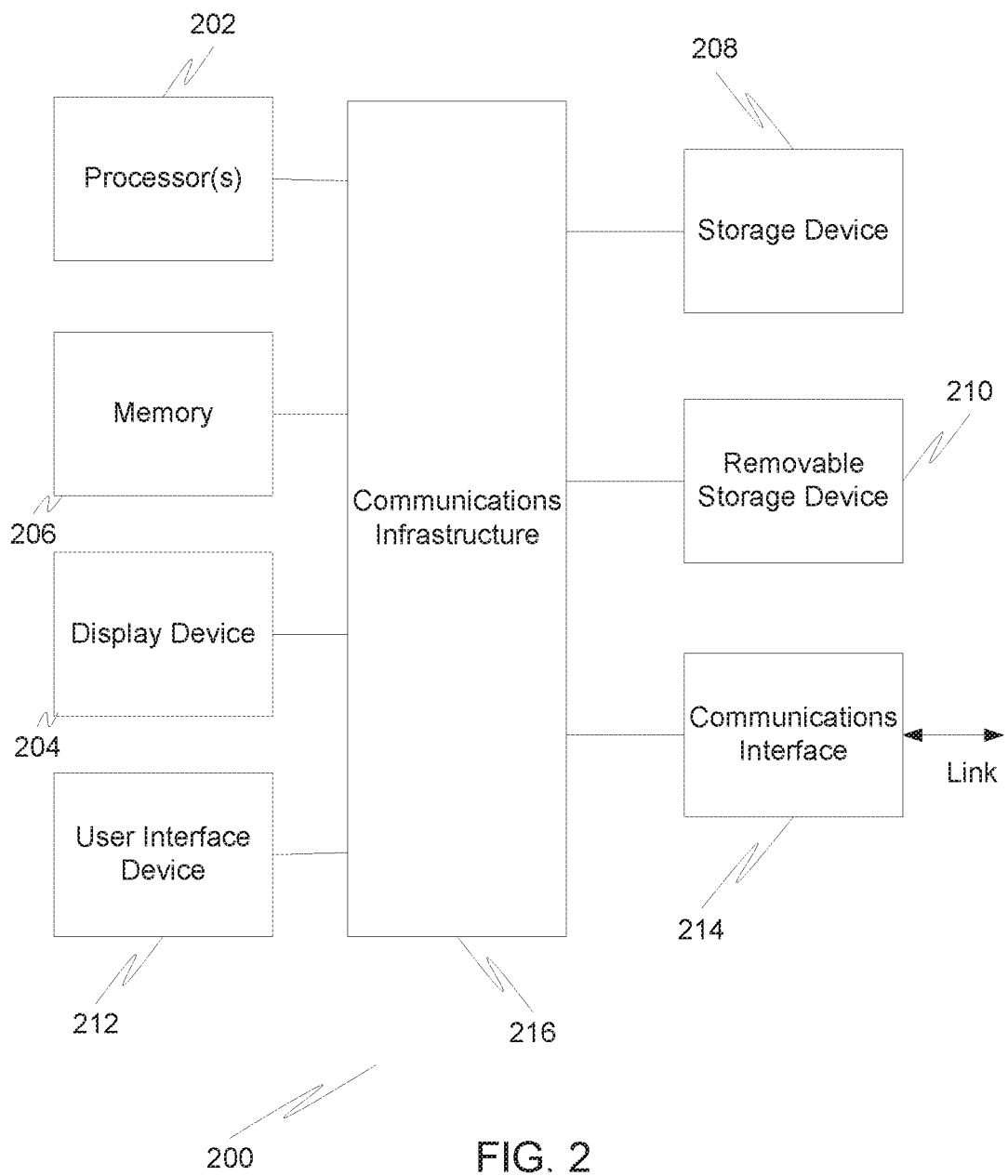
FIG. 2 is a high level block diagram showing a computer system, which is suitable for implementing a controller.

FIG. 2 is a high level block diagram showing a computer system 200, which is suitable for implementing a controller 124 used in embodiments. The computer system may have many physical forms ranging from an integrated circuit, a printed circuit board, and a small handheld device up to a huge super computer. The computer system 200 includes one or more processors 202, and further can include an electronic display device 204 (for displaying graphics, text, and other data), a main memory 206 (e.g., random access memory (RAM)), storage device 208 (e.g., hard disk drive), removable storage device 210 (e.g., optical disk drive), user interface devices 212 (e.g., keyboards, touch screens, keypads, mice or other pointing devices, etc.), and a communications interface 214 (e.g., wireless network interface). The communications interface 214 allows software and data to be transferred between the computer system 200 and external devices via a link. The system may also include a communications infrastructure 216 (e.g., a communications bus, cross-over bar, or network) to which the aforementioned devices/modules are connected.

Information transferred via communications interface 214 may be in the form of signals such as electronic, electromagnetic, optical, or other signals capable of being received by communications interface 214, via a communication link that carries signals and may be implemented using wire or cable, fiber optics, a phone line, a cellular phone link, a radio frequency link, and/or other communication channels. With such a communications interface 214, it is contemplated that the one or more processors 202 might receive information from a network, or might output information to the network in the course of performing the above-described method steps. Furthermore, method embodiments may execute solely upon the processors 202 or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
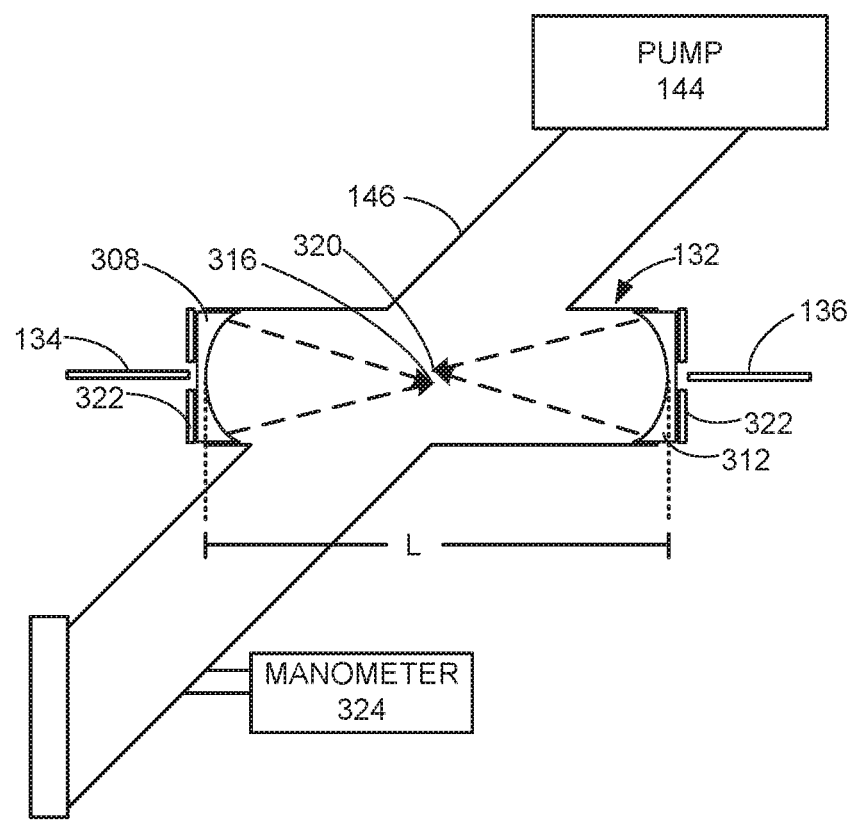
FIG. 3 is a more detailed schematic view of the cavity ring down device of the embodiment, shown in FIG. 1.

FIG. 3 is a more detailed schematic view of the CRDD 132 of the embodiment, shown in FIG. 1. The exhaust pipe 146 extends from the output of exhaust pump 144. In this example, the exhaust pipe 146 extends at an approximate 45° angle from the exhaust pump 144. The CRDD 132 is connected to the exhaust pipe 146. The CRDD 132 comprises a first cavity ring down mirror 308 on a first side of the CRDD 132 and a second cavity ring down mirror 312 on a second side of the CRDD 132. The laser light source 134 is positioned to illuminate the first cavity ring down mirror 308. The light detector 136 is positioned to receive light from the second cavity ring down mirror 312. Heaters 322 are placed around the first cavity ring down mirror 308 and the second cavity ring down mirror 312. The heaters 322 may have heat sensors. The heaters 322 may be electrically connected to and controlled by the controller 124 (FIG. 1) and may provide temperature data to the controller 124. A manometer 324 for measuring pressure is connected to the exhaust pipe 146. Pressure and temperature measurements may be used to make absolute calibration measurements of $SiF_4$. For measuring an etch front, control of the nitrogen ($N_2$) purge of the turbopump helps to improve accuracy of the measurement. A highly accurate mass flow controller of the flow of $N_2$, with a range of 100-1000 standard cubic centimeter per minute (sccm) helps to provide such an accuracy. The improved accuracy improves the accuracy of the CRDD 132.

In an example of an embodiment, the first cavity ring down mirror 308 and the second cavity ring down mirror 312 are separated to form a cavity length of about 10 cm. The first cavity ring down mirror 308 and the second cavity ring down mirror 312 have a diameter of about 1 inch (2.54 centimeters (cm)). In this embodiment, the respective radii of curvature of the first cavity ring down mirror 308 and the second cavity ring down mirror 312 are configured such that the placement of the first cavity ring down mirror 308 and the second cavity ring down mirror is near-confocal. The near-confocal placement causes the focal point of the first cavity ring down mirror 308 to be near the focal point of the second cavity ring down mirror 312. FIG. 3 shows that the focal point 316 of the first cavity ring down mirror 308 is near the focal point 320 of the second cavity ring down mirror 312. The first cavity ring down mirror 308 has a first surface on a first side and a second surface on a second side. The second cavity ring down mirror 312 has a first surface on a first side and a second surface on a second side. In this embodiment, the first surface of the first cavity ring down mirror 308 and the first surface of the second cavity ring down mirror 312 each are a spherical, concave mirror shape, with the same radius of curvature R, where R would be twice the distance of the focal length. In this embodiment, the first cavity ring down mirror 308 would be placed a distance L from the second cavity ring down mirror 312, as shown. The distance L is two focal lengths, which is equal to the radius of curvature of the first surface of the first cavity ring down mirror 308 and the radius of curvature of the first surface of the second cavity ring down mirror 312. As a result, the center of curvature for the first surface of the second cavity ring down mirror 312 is near the first surface of the first cavity ring down mirror 308. In addition, the center of curvature for the first surface of the first cavity ring down mirror 308 is near the first surface of the second cavity ring down mirror 312. This near-confocal configuration makes the CRDD 132 relatively insensitive to misalignment, since a small mirror tilt of one mirror still leaves the focal point near the first surface of the other mirror. Heaters 322 are placed adjacent to the first cavity ring down mirror 308 and the second cavity ring down mirror 312. The first cavity ring down mirror 308 and the second cavity ring down mirror 312 are between 99.90% to 99.999 reflective of light of the wavelength provided by the laser light source 134, when the first cavity ring down mirror 308 and the second cavity ring down mirror 312 are heated to a set temperature range by the heaters 322.

Near confocal means that the distance between the focal point of the first cavity ring down mirror 308 and the focal point of the second cavity ring down mirror 312 is less than 20% of the distance between the first cavity ring down mirror 308 and the second cavity ring down mirror 312. In another embodiment, the distance between the focal point of the first cavity ring down mirror 308 and the focal point of the second cavity ring down mirror 312 is less than 10% of the distance between the first cavity ring down mirror 308 and the second cavity ring down mirror 312.

Figure 4:
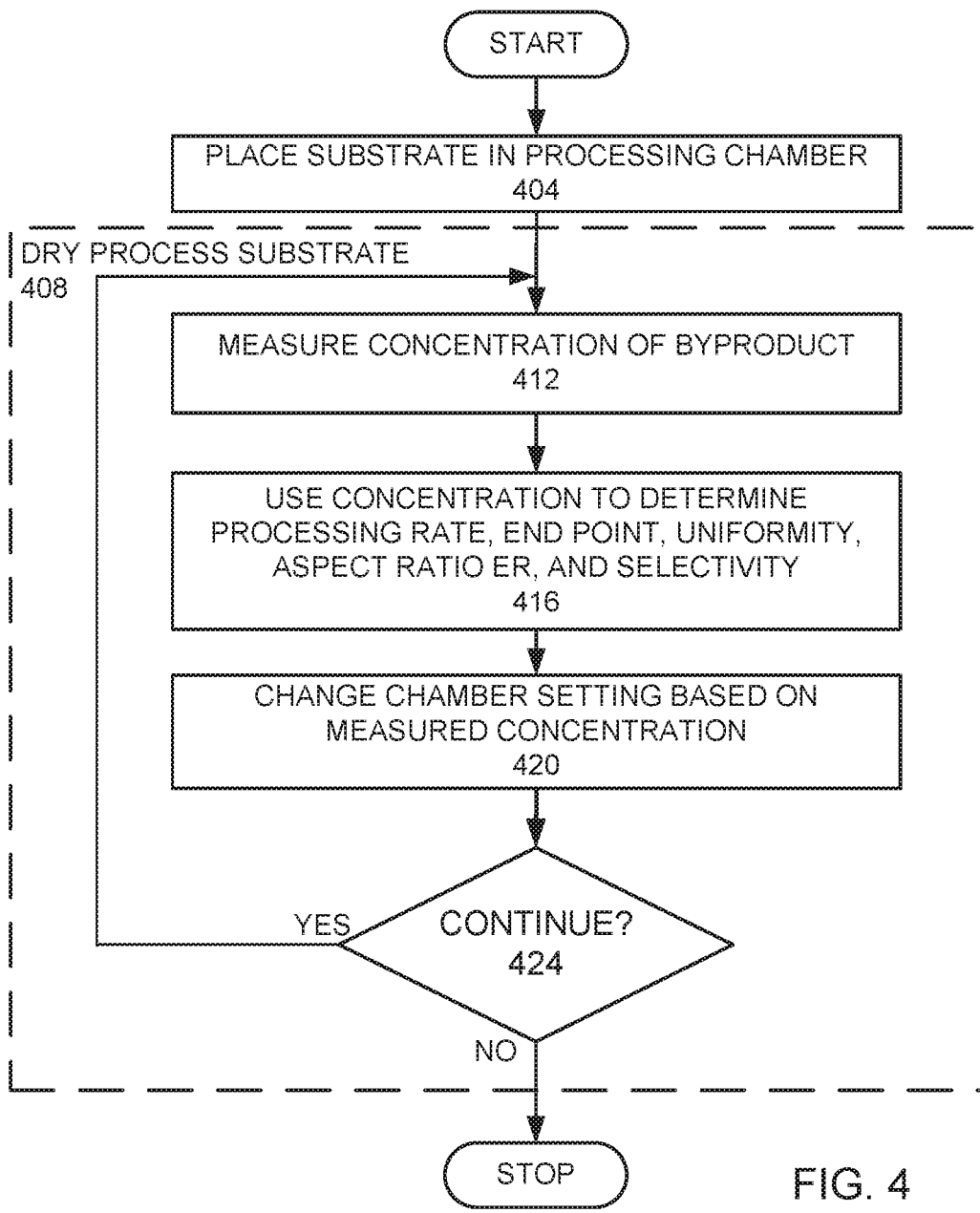
FIG. 4 is a high level flow chart of a process used in an embodiment.

To facilitate understanding, FIG. 4 is a high level flow chart of a process used in an embodiment. A substrate is placed in a processing chamber (step 404). The substrate is dry processed (step 408). During the dry processing, a gas byproduct is created. The concentration of the gas byproduct is measured (step 412). The measured concentration of the gas byproduct is used to determine one or more process parameters, including, for example, processing rate, endpoint, uniformity, aspect ratio dependent etch rate, and selectivity (step 416). Chamber settings are changed accordingly as appropriate, based on the measured concentration of the gas byproduct (step 420). A determination is made on whether the dry process is complete (step 424). If the dry process is not complete, the dry processing of the substrate 122 (step 408) is continued and the concentration of the byproduct is measured again (step 412), continuing the cycle. If the dry process is complete, then the process is stopped.

EXAMPLES

In an example of an exemplary embodiment, a substrate with a silicon containing layer is placed in a processing chamber (step 404).

A dry process is performed on the substrate in the processing chamber, where the dry process creates at least one gas byproduct (step 408). In different embodiments, either the substrate is a silicon wafer, which is etched, or one or more silicon containing layers over the substrate are etched. In this example, a stack of alternating silicon oxide and silicon nitride layers is etched. Such an alternating stack of silicon oxide and silicon nitride is designated as ONON, which is used in 3D memory devices. In this example, there are at least eight alternating layers of ONON. In other embodiments, alternating layers of silicon oxide and polysilicon (OPOP) may be etched. In etching the ONON stack, both ER and selectivity decrease with aspect ratio, meaning that the difference between etch rates of the silicon oxide and silicon nitride decreases as aspect ratio, the ratio of the etch depth over the etch width, increases. To etch the ONON stack, an etch gas of hydrofluorocarbon ($C_xF_yH_z$) and oxygen ($O_2$) is provided by the gas source 130. RF power is provided by the plasma power supply 106 to the TCP coil 110 to transform the etch gas into an etch plasma, which etches the stack and forms at least one gas byproduct, which in this example is $SiF_4$. Other etch byproducts such as $SiBr_4$ or $SiCl_4$ can be monitored depending on the gas chemistry by tuning the laser light source 134 to the absorption band of each byproduct.

During the dry process, the concentration of at least one gas byproduct is measured (step 412). In this embodiment, exhaust from the exhaust pump 144 flows to the CRDD 132. The laser light source 134 provides a beam of laser light at a wavelength of about 10 microns for the detection of $SiF_4$ onto the second surface of the first cavity ring down mirror 308. Between 0.1% to 0.001% of the light from the laser light source 134 is transmitted through the first cavity ring down mirror 308. In this embodiment, the first cavity ring down mirror 308 and the second cavity ring down mirror 312 reflect and focus at least 99.9% of the light within the cavity. The light in the cavity builds up due to constructive interference. After a predetermined time period, the laser light source 134 is directed to stop emitting the beam of laser light. The light present in the cavity continues to reflect and focus in a decaying manner between the first cavity ring down mirror 308 and the second cavity ring down mirror 312. In this embodiment, the second cavity ring down mirror 312 transmits between 0.1% to 0.001% of the light, which is received by the light detector 136. Data from the light detector 136 is sent to the controller 124, which uses the data to determine the concentration of the $SiF_4$. In this example, the time it takes for the light to decay to 1/e of the initial intensity is used to determine the concentration of $SiF_4$.

The measured concentration is used to determine one or more process parameters including, for example, processing rate, endpoint, uniformity, and selectivity (step 416). A look up table or library may be used to determine the one or more process parameters based on measured concentration.

Chamber settings may be changed accordingly based on the measured concentration (step 420). When the endpoint is not found using the measured concentration (step 424), the etch process is continued and the process is continued back at step 412. If the endpoint (i.e., etch stop) is found, the etch process may be stopped by stopping the flow of the etch gas or by stopping the power from the plasma power supply 106 or both. If it is determined that the ER is too low, etch parameters such as gas or RF power may be changed to increase the ER. If it is determined that the nonuniformity is too high, parameters such as gas feed to different regions of the chamber or ESC zones and/or temperatures may be changed to improve uniformity.

The heaters 322 are used to maintain the first cavity ring down mirror 308 and the second cavity ring down mirror 312 at a temperature of about 120° C. The heating prevents or reduces deposition on the first cavity ring down mirror 308 and the second cavity ring down mirror 312. Reducing or eliminating the deposition on the first cavity ring down mirror 308 and the second cavity ring down mirror 312 minimizes reflective interference caused by the deposition. The first cavity ring down mirror 308 and the second cavity ring down mirror 312 are temperature compensated to provide the desired reflection and/or transmission at a temperature of about 120° C. The pressure measurements provided by the manometer 324 may be used to supplement the concentration calculation of the byproduct.

Advantages of placing the CRDD 132 right after the exhaust pump 144 are that the gas received from the exhaust pump 144 is denser than the gas in the plasma processing confinement chamber 104, and latency or measurement lag is at a minimal. In addition, reflective surfaces of the first and second cavity ring down mirrors 308 and 312 are not exposed to the plasma in the plasma processing confinement chamber 104, so that such reflective surfaces would not be degraded by the plasma. $N_2$ gas purge can be flowed past the first cavity ring down mirror 308 and the second cavity ring down mirror 312 to minimize gas contact and deposition. Additional coatings, such as $MgF_2$, can be deposited on the first cavity ring down mirror 308 and the second cavity ring down mirror 312 to protect them from being etched by acid byproducts such as hydrogen fluoride (HF) during processing or during chamber venting.

Figure 5:
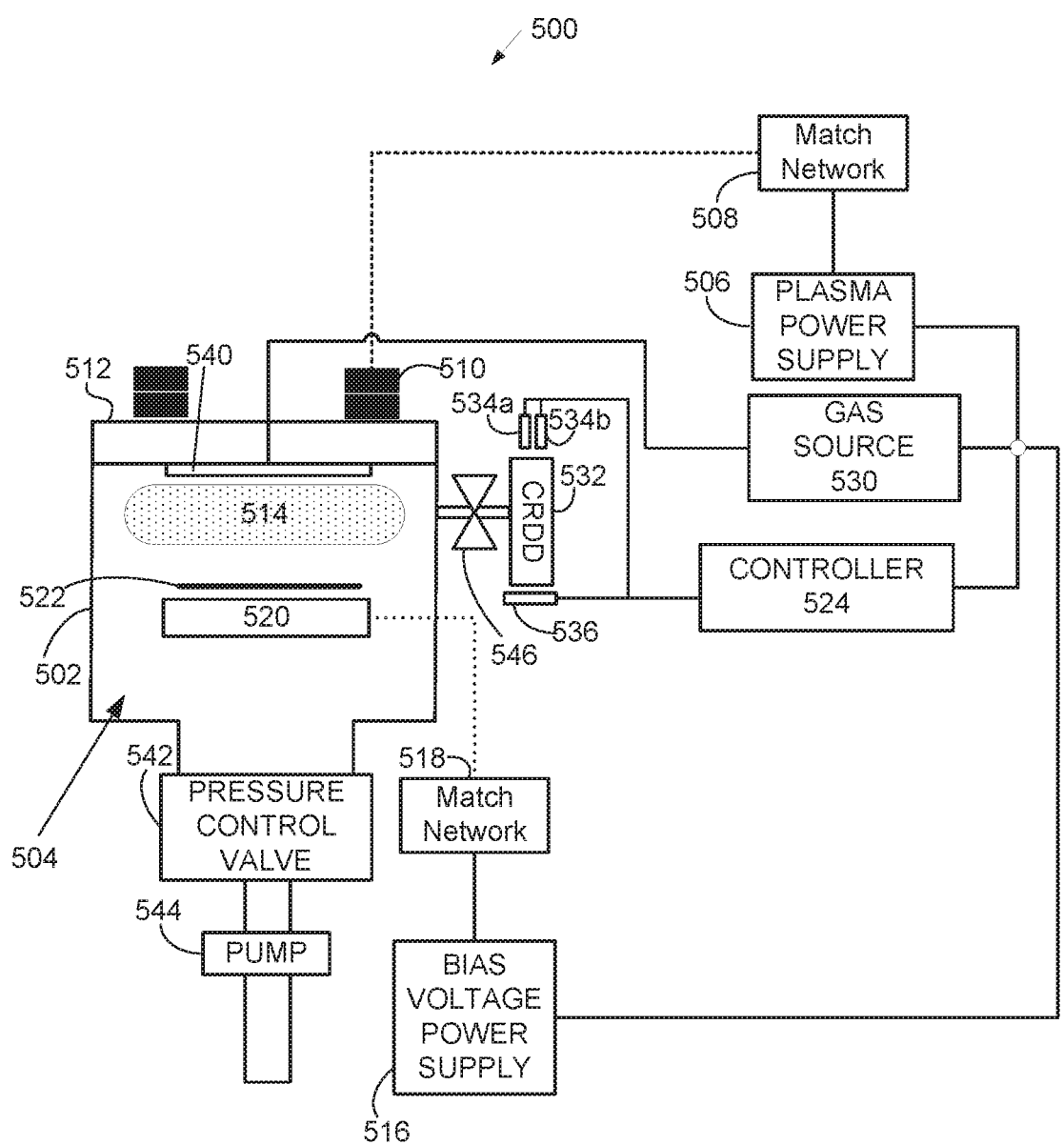
FIG. 5 is a schematic view of another embodiment.

FIG. 5 is a schematic illustration of a plasma processing chamber 500 used in another embodiment. The plasma processing system 500 includes a plasma reactor 502 having a plasma processing confinement chamber 504 therein. A plasma power supply 506, tuned by a match network 508, supplies power to a TCP coil 510 located near a power window 512 to create a plasma 514 in the plasma processing confinement chamber 504 by providing an inductively coupled power. The TCP coil (upper power source) 510 may be configured to produce a uniform diffusion profile within the plasma processing confinement chamber 504. For example, the TCP coil 510 may be configured to generate a toroidal power distribution in the plasma 514. The power window 512 is provided to separate the TCP coil 510 from the plasma processing confinement chamber 504 while allowing energy to pass from the TCP coil 510 to the plasma processing confinement chamber 504. A wafer bias voltage power supply 516 tuned by a match network 518 provides power to an electrode 520 to set the bias voltage on the substrate 522 which is supported by the electrode 520. A controller 524 sets operating and/or process points for the plasma power supply 506 and the wafer bias voltage power supply 516.

The plasma power supply 506 and the wafer bias voltage power supply 516 may be configured to operate at specific radio frequencies such as, for example, 13.56 MHz, 27 MHz, 2 MHz, 60 MHz, 200 kHz, 2.54 GHz, 400 kHz, and 1 MHz, or combinations thereof. Plasma power supply 506 and wafer bias voltage power supply 516 may be appropriately sized to supply a range of powers in order to achieve desired process performance. For example, in one embodiment, the plasma power supply 506 may supply the power in a range of 50 to 5000 Watts, and the wafer bias voltage power supply 516 may supply a bias voltage in a range of 20 to 2000 V. For a bias voltage up to 4 kV or 5 kV, a power of no more than 25 kW is provided. In addition, the TCP coil 510 and/or the electrode 520 may be comprised of two or more sub-coils or sub-electrodes, which may be powered by a single power supply or powered by multiple power supplies.

The plasma processing system 500 further includes a gas source/gas supply mechanism 530. The gas source 530 is in fluid connection with plasma processing confinement chamber 504 through a gas inlet, such as a shower head 540. The gas inlet may be located in any advantageous location in the plasma processing confinement chamber 504, and may take any form for injecting gas. Preferably, however, the gas inlet may be configured to produce a "tunable" gas injection profile, which allows independent adjustment of the respective flow of the gases to multiple zones in the plasma processing confinement chamber 504. The process gases and byproducts are removed from the plasma processing confinement chamber 504 via a pressure control valve 542 and a pump 544. The pressure control valve 542 and the pump 544 also collectively serve to maintain a desired pressure within the plasma processing confinement chamber 504. The gas source/gas supply mechanism 530 is controlled by the controller 524.

In this embodiment, a pipe controlled by a valve 546 allows plasma 514 to pass from the plasma processing confinement chamber 504 to a cavity ring down device (CRDD) 532. A first laser light source 534*a* and a second laser light source 534*b* are positioned adjacent to the CRDD 532, so that respective laser beams from the first laser light source 534 and second laser light source 534*b* are directed into the CRDD 532. The laser beams can traverse the length of the CRDD 532 multiple times (typically for a distance greater than 1 kilometer) to allow parts per trillion (ppt) level detection limits to be achieved. The laser beams are absorbed by the gas present within the CRDD 532 as they travel inside the CRDD 532. A light detector 536 is positioned adjacent to the CRDD 532 to measure the light absorption level.

In the operation of this embodiment, concentration of a species in the plasma 514 is measured by opening the valve 546 to allow plasma 514 to pass from the plasma processing confinement chamber 504 through the pipe and valve 546 into the CRDD 532. The first laser light source 534a provides a beam of first laser light at a first wavelength of about 600 nm (corresponding to a first frequency) onto a second surface of a first cavity ring down mirror (not shown). Between 0.1% to 0.001% of the light from the first laser light is transmitted through the first cavity ring down mirror. In this embodiment, the first cavity ring down mirror and a second cavity ring down mirror (not shown) reflect and focus at least 99.9% of the first laser light within the cavity. The first laser light in the cavity builds up due to constructive interference. After a predetermined time period, the first laser light source 534a is directed to stop emitting the beam of first laser light. The first light present in the cavity continues to reflect and focus in a decaying manner between the first cavity ring down mirror and the second cavity ring down mirror. In this embodiment, the second cavity ring down mirror transmits between 0.1% to 0.001% of the first laser light, which is received by the light detector 536. Data from the light detector 536 is sent to the controller 524, which uses the data to determine the concentration of a species in the plasma 514. In this example, the time it takes for the first laser light to decay to 1/e of the initial intensity is used to determine the concentration of the species.

A second laser light source 534b provides a beam of second laser light at a second wavelength of about 1600 nm (corresponding to a second frequency) onto the second surface of the first cavity ring down mirror (not shown). Between 0.1% to 0.001% of the light from the second laser light is transmitted through the first cavity ring down mirror. In this embodiment, the first cavity ring down mirror and the second cavity ring down mirror reflect and focus at least 99.9% of the second laser light within the cavity. The second laser light in the cavity builds up due to constructive interference. After a predetermined time period, the second laser light source 534b is directed to stop emitting the beam of second laser light. The second light present in the cavity continues to reflect and focus in a decaying manner between the first cavity ring down mirror 308 and the second cavity ring down mirror 312. In this embodiment, the second cavity ring down mirror transmits between 0.1% to 0.001% of the second laser light, which is received by the light detector 536. Data from the light detector 536 is sent to the controller 524, which uses the data to determine the concentration of a species in the plasma. In this example, the time it takes for the second laser light to decay to 1/e of the initial intensity is used to determine the concentration of the species. The measurement of the second laser light may be used to more accurately measure the concentration of the same species that is previously measured based on the first laser light or to measure the concentration of another species. In one embodiment, one species that is detected is oxygen and another species detected is water vapor.

In this embodiment, the first cavity ring down mirror and the second cavity ring down mirror have a multilayer coating that is highly reflective of the first laser light and the second laser light. Since the cavity is only exposed to plasma 514 when the valve 546 is open, the valve 546 acts as a shutter, controlling the flow of plasma 514 from the plasma processing confinement chamber 504 to the CRDD 532 and limiting the exposure of the first cavity ring down mirror and the second cavity ring down mirror to the plasma 514, thereby reducing deposition on the first cavity ring down mirror and the second cavity ring down mirror. In this configuration, since the CRDD 532 is situated in relatively close proximity to the plasma processing confinement chamber 504, the CRDD 532 can be used to monitor short lived species, such as radicals, in the plasma 514.

Figure 6:
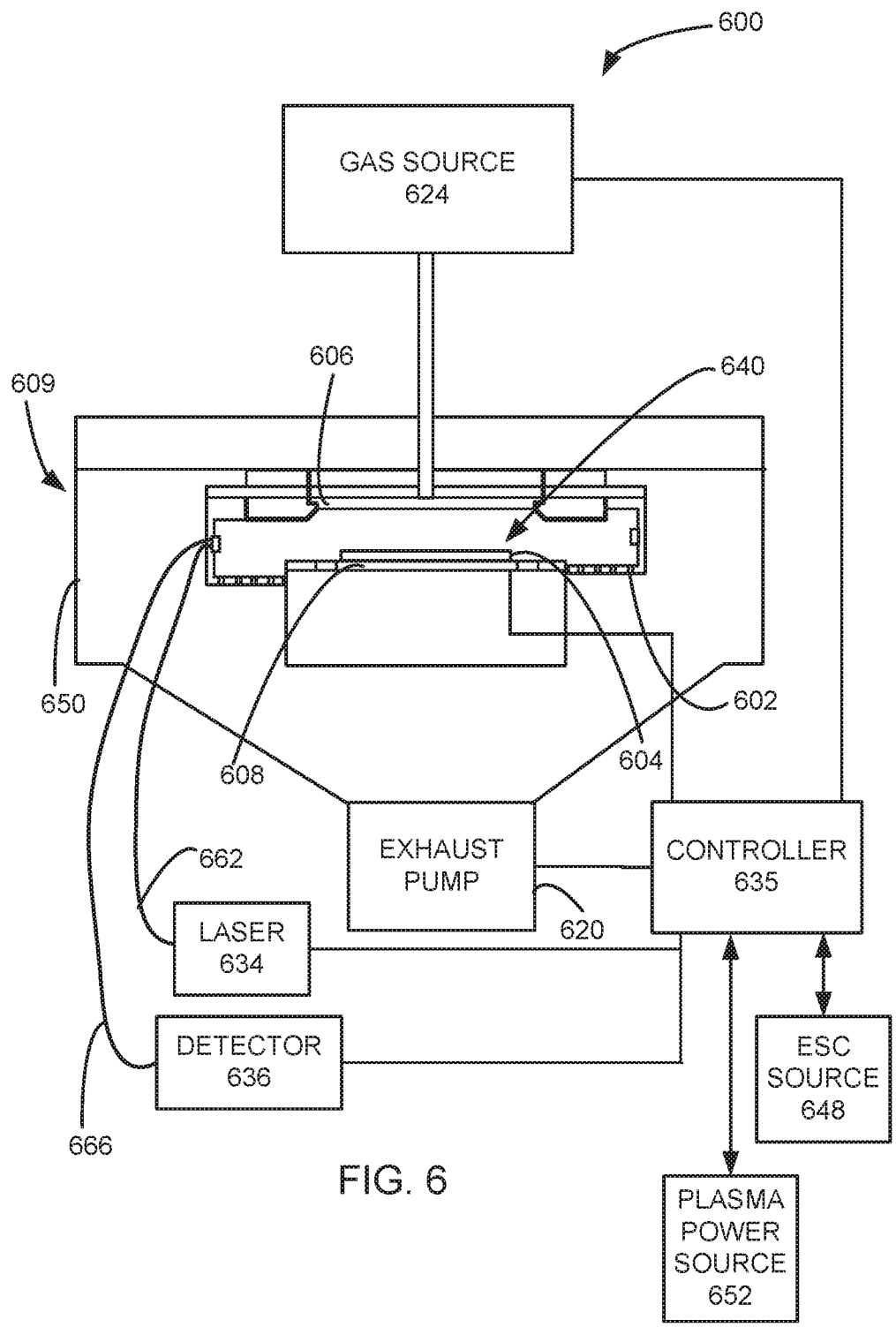
FIG. 6 is a schematic view of an etch reactor used in another embodiment.

In other embodiments, the CRDD is in or forms part of the plasma processing system. FIG. 6 is a schematic view of an etch reactor 600 that may be used in practicing such an embodiment. The etch reactor 600 comprises a gas distribution plate 606 providing a gas inlet and a chuck 608, within an etch chamber 609, enclosed by a chamber wall 650. Within the etch chamber 609, a substrate 604 is positioned on top of the chuck 608. The chuck 608 may also provide a bias from the ESC source 648, for holding the substrate 604 or may use another chucking force to hold the substrate 604. A plasma power source 652 provides RF power to an electrode, which may be part of the chuck 608 or the gas distribution plate 606, for forming a gas into a plasma. A gas source 624 is connected to the etch chamber 609 through the gas distribution plate 606. A plasma confinement shroud, which in this embodiment is a C-shroud 602, surrounds the plasma volume. A laser 634 and a light detector 636 are controllably connected to a controller 635. First and second optical fibers 662 and 666 are optically connected between a cavity ring down device CRDD and the laser 634 and light detector 636, respectively. In this example, the plasma is generated using capacitive coupling. The laser 634 has a tuning range that will cover more than the band for $SiF_4$ infrared (IR) band and the extra tuning may be used to detect any deposition like a $C_xF_y$ polymer deposition, so that the laser 634 can be used to monitor $SiF_4$ peak and at the same time other film peaks and track the level of deposition on mirrors and windows within the etch chamber 609. The measurement of the $SiF_4$ peak and at the same time other film peaks and the level of deposition on mirrors and windows within the etch chamber 609 may be used for tracking the status of the CRDD to determine maintenance of the system and robustness of the measurements.

Figure 7:
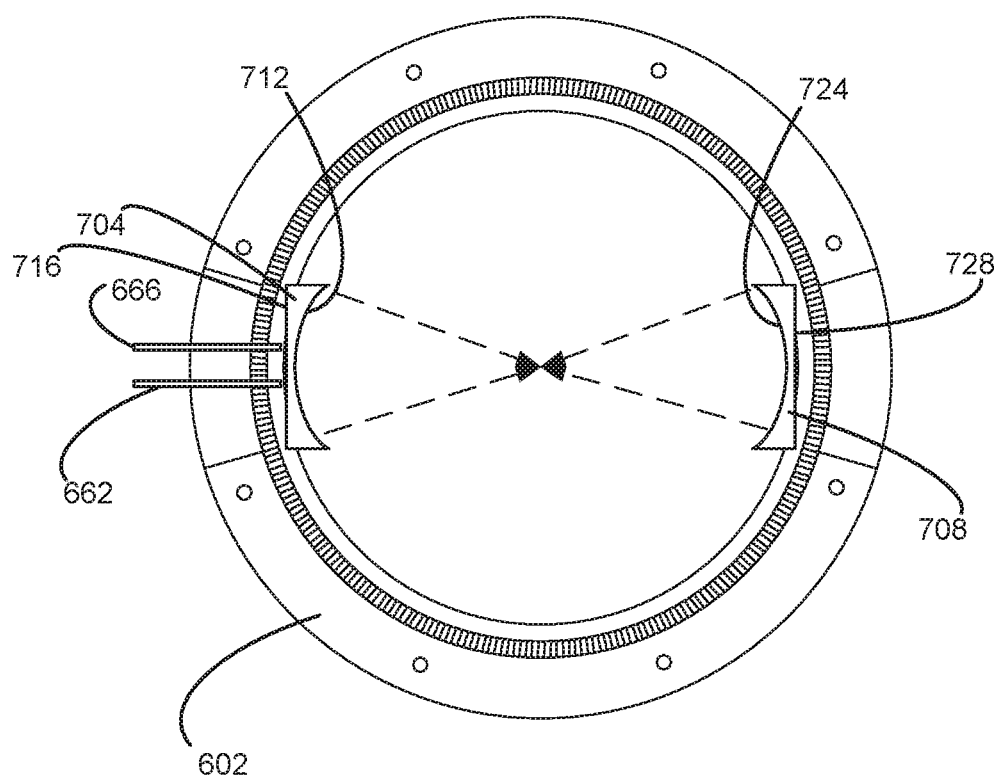
FIG. 7 is a schematic top view of the plasma volume formed by the confinement shroud (C-shroud).

FIG. 7 is a schematic top view of the plasma volume formed by the C-shroud 602. In this embodiment, the CRDD is defined by the volume between a first cavity ring down mirror 704 and a second cavity ring down mirror 708, where a portion of the inner volume of the etch chamber 609 is between the first cavity ring down mirror 704 and the second cavity ring down mirror 708. The first cavity ring down mirror 704 is place near one side of the C-shroud 602, and the second cavity ring down mirror 708 is placed on a second side of the C-shroud 602 facing the first cavity ring down mirror 704. The first cavity ring down mirror 704 has a first surface 712 on a first side and a second surface 716 on a second side. The second cavity ring down mirror 708 has a first surface 724 on a first side and a second surface 728 on a second side. In this embodiment, the first and second optical fibers 662, 666, respectively, are directed to the second surface 716 of the first cavity ring down mirror 704 to allow a laser light beam to irradiate the second surface 716 of the first cavity ring down mirror 704.

In this embodiment, the laser 634 provides a beam of laser light at a wavelength of about 10 microns (which is useful for detecting $SiF_4$) onto the first optical fiber 662, which in turn directs the laser light to the second surface 716 of the first cavity ring down mirror 704. Between 0.1% to 0.001% of the laser light is transmitted through the first cavity ring down mirror 704. In this embodiment, the first surface 712 of the first cavity ring down mirror 704 and the first surface 724 of the second cavity ring down mirror 708 reflect and focus at least 99.9% of the laser light within the cavity. The second surface 728 of the second cavity ring down mirror 708 faces away from the first cavity ring down mirror 704. The first surface 724 of the second cavity ring down mirror 708 faces towards the first cavity ring down mirror 704. The laser light is reflected back and forth in the cavity formed between the first surface 724 of the second cavity ring down mirror 708 and the first surface 712 of the first cavity ring down mirror 704. The laser light in the cavity builds up due to constructive interference. After a predetermined time period, the laser light source 634 is directed to stop emitting the beam of laser light. The light present in the cavity continues to reflect and focus in a decaying manner between the first cavity ring down mirror 704 and the second cavity ring down mirror 708. In this embodiment, the second ring cavity down mirror 708 transmits between 0.1% to 0.001% of the laser light, which is transmitted to the light detector 636. Data from the light detector 636 is sent to the controller 635, which uses the data to determine the concentration of a species in the plasma. In this example, the time it takes for the laser light to decay to 1/e of the initial intensity is used to determine the concentration of the species. In this embodiment, the CRDD is defined by the volume between the first cavity ring down mirror 704 and the second cavity ring down mirror 708, where a portion of the inner volume of the etch chamber 609 is between the first cavity ring down mirror 704 and the second cavity ring down mirror 708.

Performing the detection within the plasma volume reduces measurement lag time. However, concentrations of gases within the plasma volume are much lower than concentrations of gases in the exhaust. The increased path length provided by the CRDD compensates for the lower concentrations of gases. Also, to maintain the quality of the CRDD, heaters and other devices may be used to help prevent the plasma from degrading the first cavity ring down mirror 704 and the second cavity ring down mirror 708.

Various embodiments are useful for providing memory devices such as DRAM and 3D-NAND devices. In various embodiments, the plasma process is an etch process of a silicon containing layer or a low-k dielectric layer. In various embodiments, the RF power may be inductively coupled or capacitively coupled. In other embodiments, alternating layers of silicon oxide and polysilicon (OPOP) may be etched.

In various embodiments, a gas measurement system is provided that uses a cavity ring down device. The cavity ring down device is in fluid communication with a processing chamber. The fluid communication may be by receiving exhaust from the processing chamber or plasma from the processing chamber, or may analyze plasma in-situ in the processing chamber. The cavity ring down device has a first cavity ring down mirror and a second cavity ring down mirror, which is spaced apart from the first cavity ring down mirror and forms a volume defining the cavity ring down device. A laser light source, such as a laser, is optically coupled to the first cavity ring down mirror. The optical coupling could be directing a laser beam to an outer surface of the first cavity ring down mirror or could be provided by connecting a laser to an outer surface of the first cavity ring down mirror by fiber optics or by other processes that provide laser light to an outer surface of the first cavity ring down mirror. A light detector is optically coupled to either the first cavity ring down mirror or the second cavity ring down mirror. The optical coupling may provide various ways for the optical detector to receive light transmitted through either the first cavity ring down mirror or the second cavity ring down mirror. The optical coupling may be provided by placing the optical detector near an outer surface of either the first cavity ring down mirror or the second cavity ring down mirror or by using fiber optics to direct light from an outer surface of either the first cavity ring down mirror or the second cavity ring down mirror or by another optical method.

Various embodiments provide a smaller gas measurement device that provides a higher measurement accuracy, where the gas measurement device is less expensive than previous gas measurement devices. CRDD are able to be smaller than other devices, since CRDD allow for light beams to be reflected more times than other measurement system. The increased number of reflections increases sampling path length, which increases accuracy. Other embodiments may include a combination of the above embodiments. For example, one embodiment may have a first CRDD for measuring a remote plasma and a second CRDD located within a processing chamber. In various embodiments, the high reflectivity of the cavity ring down mirrors is provided by high-reflector coatings, which are reflective over one or more bands of wavelengths. Such coatings may use quarter wavelength layers, which cause constructive interference. In the alternative, such coatings may be multilayers, using different index of refractions to increase reflection.

In other embodiments, the first cavity ring down mirror may have a first radius of curvature $R_1$ and the second cavity ring down mirror may have a second radius of curvature $R_2$. The first cavity ring down mirror and the second cavity ring down mirror are separated by a length L. $g_1$ is defined as $g_1=1-L/R_1$. $g_2$ is defined as $g_2=1-L/R_2$. To provide a stable optical cavity for the CRDD, the condition $0 \leq g_1 g_2 \leq 1$ is satisfied. In such embodiments, near confocal is defined as $g_1 g_2$ and being between 0.64 and 0.81 inclusive.

Other embodiments may detect other molecules, such as water, oxygen ($O_2$) or carbon dioxide ($CO_2$). For the detection of other molecules, other wavelengths may be used. The wavelengths may be ultraviolet (UV), visible, near IR, or mid IR. Other embodiments may be used for end point detection in a plasma, or a wet clean endpoint detection, etch rate measurement, chamber matching, or other measurements.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. An apparatus for processing a substrate, comprising:
   a processing chamber;
   a substrate support within the processing chamber;
   a gas inlet for providing a process gas into the processing chamber, wherein when a process is carried out to process the substrate in the processing chamber, the process provides a gas byproduct;
   a gas source for providing the process gas to the gas inlet;

an exhaust pump for pumping the gas byproduct from the processing chamber; and a parameter measurement system, comprising:

a cavity ring down device in fluid communication with the processing chamber, comprising:

a first cavity ring down mirror on a first side of the cavity ring down device; and a second cavity ring down mirror on a second side of the cavity ring down device spaced apart from the first cavity ring down mirror;

at least one laser light source optically coupled to the first cavity ring down mirror; and a light detector optically coupled to either the first cavity ring down mirror or the second cavity ring down mirror.

2. The apparatus, as recited in claim 1, wherein the first cavity ring down mirror has a first surface on a first side of the first cavity ring down mirror and a second surface on a second side of the first cavity ring down mirror, wherein the second surface of the first cavity ring down mirror faces outside the cavity ring down device and the first surface of the first cavity ring down mirror faces inside the cavity ring down device, wherein the at least one laser light source is optically coupled to the second surface of the first cavity ring down mirror.

3. The apparatus as recited in claim 2, wherein the second cavity ring down mirror has a first surface on a first side of the second cavity ring down mirror and a second surface on a second side of the second cavity ring down mirror, wherein the second surface of the second cavity ring down mirror faces outside the cavity ring down device and the first surface of the second cavity ring down mirror faces inside the cavity ring down device, wherein the light detector is optically coupled to the second surface of the first cavity ring down mirror or the second surface of the second cavity ring down mirror.

4. The apparatus as recited in claim 1, wherein the first cavity ring down mirror and the second cavity ring down mirror each have a reflectivity to light from the at least one laser light source of at least 99.9% and transmission of light from the at least one laser light source of 0.1% to 0.001%.

5. The apparatus, as recited in claim 1, further comprising one or more heaters for heating the first and second cavity ring down mirrors to a temperature of at least 120° C.; and wherein the first cavity ring down mirror and the second cavity ring down mirror are temperature compensated to operate at a temperature of at least 120° C.

6. The apparatus, as recited in claim 1, wherein the at least one laser light source provides a first light beam at a first frequency and a second light beam at a second frequency that is different from the first frequency.

7. The apparatus, as recited in claim 1, wherein the cavity ring down device is in fluid communication with the processing chamber by receiving the gas byproduct from the processing chamber via the exhaust pump.

8. The apparatus, as recited in claim 7, wherein the parameter measurement system uses the gas byproduct and light generated by the at least one laser light source and reflected between the first and second cavity ring down mirrors to measure one or more process parameters and adjust the process based on the one or more process parameters.

9. The apparatus, as recited in claim 1, wherein the cavity ring down device is in fluid communication with the processing chamber by receiving plasma from the processing chamber, the apparatus further comprising a valve for controlling flow of the plasma between the processing chamber and the cavity ring down device.

10. The apparatus, as recited in claim 9, wherein the parameter measurement system uses the gas byproduct and light generated by the at least one laser light source and reflected between the first and second cavity ring down mirrors to measure one or more process parameters and adjust the process based on the one or more process parameters.

11. The apparatus, as recited in claim 1, wherein the cavity ring down device is in fluid communication with the processing chamber in that a portion of an inner volume of the processing chamber is between the first cavity ring down mirror and the second cavity ring down mirror; and wherein the inner volume includes plasma that is present when the process is carried out.

12. The apparatus, as recited in claim 11, wherein the parameter measurement system uses the gas byproduct and light generated by the at least one laser light source and reflected between the first and second cavity ring down mirrors to measure one or more process parameters and adjust the process based on the one or more process parameters.

13. The apparatus, as recited in claim 1, wherein the first cavity ring down mirror is near confocal with the second cavity ring down mirror.

14. The apparatus as recited in claim 1, wherein the first cavity ring down mirror and the second cavity ring down mirror have a reflectivity to light from the at least one laser light source of at least 99.99% and transmission of light from the at least one laser light source of 0.01% to 0.001%.

* * * * *